(12) United States Patent
Sankabathula et al.

(10) Patent No.: US 8,090,035 B2
(45) Date of Patent: Jan. 3, 2012

(54) METHOD FOR SETTING INTER-PACKET GAIN

(75) Inventors: Dharani Naga Sailaja Sankabathula, San Jose, CA (US); Partha Sarathy Murali, San Jose, CA (US); Logeshwaran Vijayan, Chennai (IN); Nagaraja Reddy Anakala, Hyderabad (IN)

(73) Assignee: Redpine Signals, Inc., San Jose, CA (US)

( * ) Notice: Subject to any disclaimer, the term of this patent is extended or adjusted under 35 U.S.C. 154(b) by 569 days.

(21) Appl. No.: 12/211,301

(22) Filed: Sep. 16, 2008

(65) Prior Publication Data

US 2010/0067623 A1    Mar. 18, 2010

(51) Int. Cl.
*H04K 1/10*  (2006.01)
*H04L 27/28* (2006.01)

(52) U.S. Cl. ........................................ 375/260; 375/345

(58) Field of Classification Search .................... 375/260
See application file for complete search history.

(56) References Cited

U.S. PATENT DOCUMENTS

| | | | |
|---|---|---|---|
| 5,490,175 A * | 2/1996 | Alameh et al. | 375/317 |
| 6,748,200 B1 * | 6/2004 | Webster et al. | 455/234.1 |
| 2003/0162518 A1 * | 8/2003 | Baldwin et al. | 455/253.2 |
| 2004/0228424 A1 * | 11/2004 | Baldwin et al. | 375/343 |

* cited by examiner

*Primary Examiner* — David C. Payne
*Assistant Examiner* — Erin File
(74) *Attorney, Agent, or Firm* — File-EE-Patents.com; Jay A. Chesavage

(57) ABSTRACT

An packet detection controller accepts an input from an AGC controller which indicates the presence of an increased signal energy and also completion of an AGC process and generates an output to suspend the AGC process. The packet detection controller also receives a plurality of IQ receiver streams and forms a single stream for use by a packet detector, which is controllable by an SNR_MODE indicating whether the signal to noise ratio is above or below a particular threshold, and a PD_RESET signal indicating that no packet detection should occur. The controller also receives a PACKET_DET signal indicating that packet detection is completed. The packet detection controller examines the incoming receiver streams and suspends AGC process if a packet detect is generated, or suspends the packet detector if an AGC process is required.

17 Claims, 13 Drawing Sheets

Hi Sig Level: AGC before PD

LOW Sig Level: PD then AGC stream_1 high SNR, stream_2 low SNR

False packet trigger response

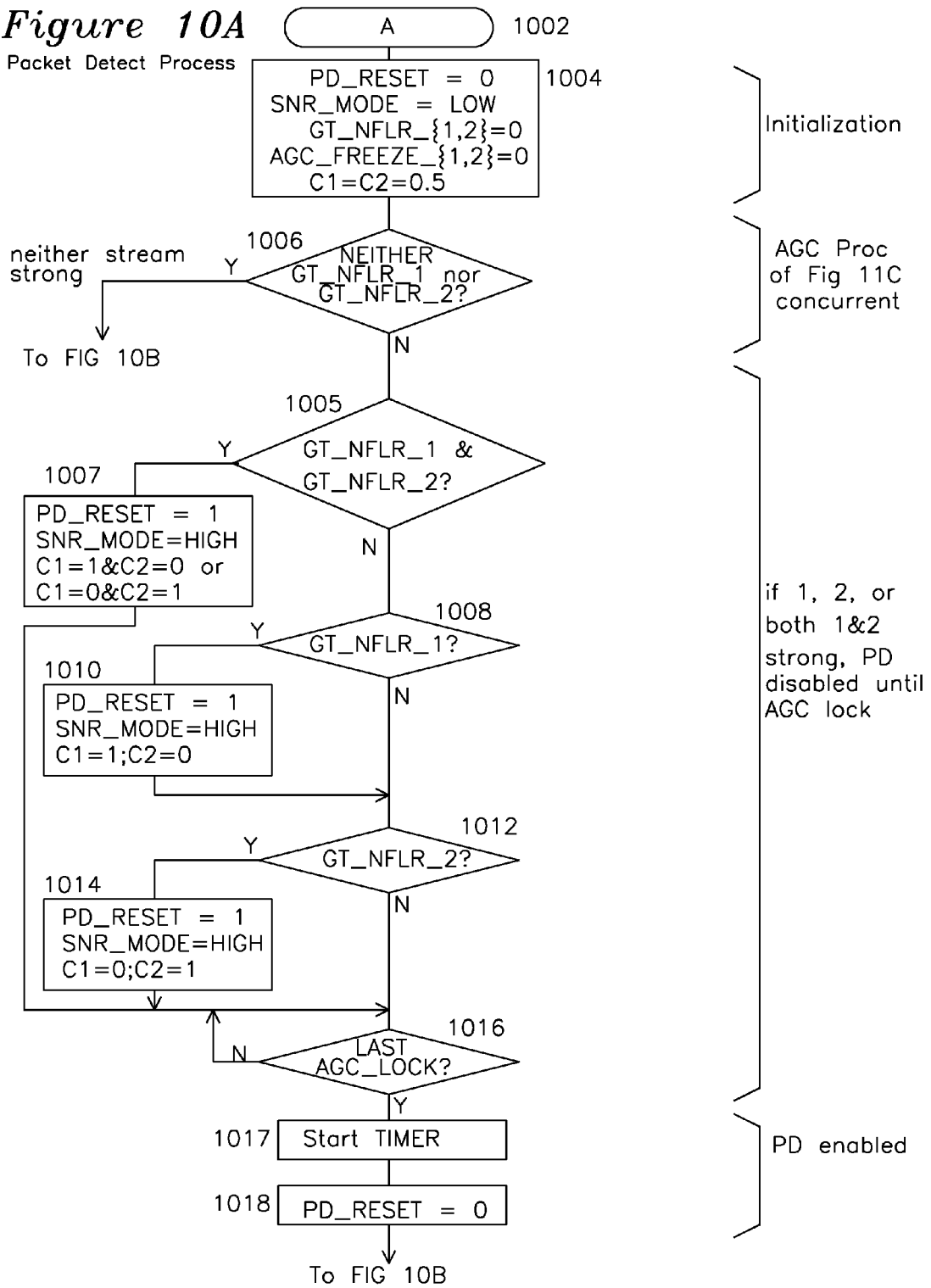

false packet handling

One shot AGC (signal level below threshold, pkt detect from BBP)

throughput vs SNR (64 QAM)

packet detect accuracy vs preamble SNR

METHOD FOR SETTING INTER-PACKET GAIN

FIELD OF THE INVENTION

The present invention relates to packet detection and AGC for a wireless receiver signal operating in the presence of variable noise and interference. More specifically, the invention relates to a packet acquisition method for detecting packets at a variety of signal strengths, and to the control of a packet detector and AGC controller for detection of low signal energy, high signal energy, and false packet signal, with particular use in systems having multiple antennas and RF front ends.

BACKGROUND OF THE INVENTION

FIG. 1 shows a prior art wireless packet 100 which includes a preamble 102 part and a frame 104 part, which frame 104 may further comprise a header and payload. The preamble part 102 is present for an interval of time T1 106, and the frame part is present for an interval of time T2 108. A wireless receiver which receives the wireless packet performs a packet detection step based on detection of the symbols of the preamble 102, and also performs a first AGC operation such that the gain of the receiver is modified to place the signal energy of the packet in a best operating range for the analog to digital converters (ADC) which are sampling the signal after conversion to baseband by an RF front end.

FIG. 2 shows an example prior art single conversion wireless receiver for a single receive channel, where incoming signals are received by antenna 202 and applied to low noise amplifier 206 having a low noise figure, with the preamplifier 206 coupled to quadrature mixers 220 and 228, which heterodyne the amplifier 206 output with a first local in-phase (I) oscillator 224 and a second local quadrature (Q) oscillator 230 with the mixer outputs coupled to low pass filters 208 and 210, respectively, to remove any image frequencies, after which the filter 208 and 210 outputs are provided to variable gain amplifiers 212 and 214, which are provided to anti-aliasing filters 216 and 218 to produce baseband outputs 252 and 254. An AGC controller 264 examines the I 248 and Q 250 receiver outputs after analog to digital (ADC) conversion 242 and 246, and generates one or more gain control outputs shown as 238. The AGC controller 264 is active during the preamble 102 part of a packet, with the general characteristic of applying a sufficiently high gain level to the variable gain amplifiers of RF receiver 204 to enable the detection of low level packets, and upon detection of a large level signal at the A/D outputs 248 and 250, reducing the RF front end 204 gain until the preamble signal is in the usable range of the A/D converters 242 and 246. The baseband signal processor 240 also includes a function for detecting start of packet, typically based on correlating the preamble with a delayed conjugated copy of the preamble which derives a preamble signal part and comparing the preamble signal part to the auto-correlation of the preamble with its conjugate, thereby deriving a signal plus noise part. Packet detect may be performed by comparing a ratio or difference of the signal part to the signal plus noise part with respect to a threshold. For wireless protocols such as 802.11b and 802.11g, the preamble is a time-domain BPSK modulated barker code which repeats over several cycles, and for 802.11, 802.11a, and 802.11e, the preamble is an OFDM subcarrier-based symbol which repeats over several cycles, such that delayed autocorrelation or cross correlation of the received preamble signal with a preamble symbol conjugate or a delayed conjugated copy of the received preamble will generate an increased correlation value at the point of repeated preamble, such that the start of packet and packet synchronization functions may be accomplished. The process of detecting the particular point in time of increased correlation for a repeated part of the preamble is known as "packet detection".

Another variation of prior art FIG. 2 is a configuration for receiving RF signals with multiple antennas, particularly in the field of multiple input multiple output (MIMO) receivers. For MIMO receivers, multiple instances of RF Front End 204 are employed, each connected to its own antenna 202 and generating a unique stream of quadrature outputs 248, 250, and each with its own AGC controller 264. The process of AGC gain control in combination with packet detection is known as packet acquisition, as it provides the requisition conditions of gain control and identification of the preamble of the packet, both of which are required for the packet to be received and demodulated.

One of the challenges of a baseband processor is the detection of low power signals, particularly those near the noise threshold of the receiver. Accordingly, one of the performance metrics of the wireless receiver is sensitivity, which is defined as the signal strength at which a packet can be received. The capability of various receivers are differentiated by the associated receiver sensitivity metric.

In the prior art method of packet acquisition, AGC gain control is followed with packet detection. In this method, the minimum receiver sensitivity (the minimum incoming signal strength for which the packet is successfully received) is limited by the receiver gain, as determined by the AGC processor 264. Only when the AGC controller 264 generates a suitable gain level can the subsequent baseband functions of converting the received packet into data to place in a packet buffer be successful, largely because the receiver might not be able to receive packets at very low SNRs, such as those less than 3 dB SNR. An additional complication is false packet detection in the MIMO configuration, where an interfering signal or a signal from a weak baseband stream causes a false packet detection. False packet detection is any event which results in the incorrect identification of a possible preamble by the packet detection circuit, and the performance consequence of false packet detection is that the demodulator may repeatedly spend a large duration of time searching for the data payload part of a packet whose packet detection was initiated by the noise, undergoing a timeout, and then repeating the process with the same noise or interferer which causes the false packet detection. During these durations of time which follow the false packet detection, actual packets may be ignored because the receiver is fruitlessly attempting to demodulate a packet from noise which triggered the packet detect circuit.

One problem of the prior art is the time delay in packet detection which results from performing AGC operations during the preamble interval prior to packet detection. For the case of a preamble having n repeating patterns, a total of n−1 preamble detection events is available, since one preamble is typically loaded into the correlator before detection may occur. If the preamble AGC time spans m such repeating pattern time intervals, there may only be n−m−1 preamble detection events, which may result in loss of preamble detection for a packet with a short preamble such as 802.11g.

Another problem of the prior art is that high and low signal to noise packets are typically handled the same way by the packet acquisition systems.

OBJECTS OF THE INVENTION

A first object of the invention is a packet acquisition controller which allows packet detection for low level signals by freezing any AGC process upon assertion of a packet detect.

A second object of the invention is a packet acquisition controller which defers packet detection for high level signals by suspending a packet detect operation until an AGC process is completed.

A third object of the invention is a packet acquisition controller which detects false packets by starting a timer after an AGC process has completed, and if a packet detect does not occur in an expected time interval thereafter, or if a false packet is detected such as by a broadband processor, the packet acquisition controller resets the AGC process and packet acquisition controller.

A fourth object of the invention is packet detect processor which receives a plurality of streams of baseband data, selects a stream with a maximum signal level, and uses that stream to perform a packet detection operation.

A fifth object of the invention is a packet detect processor which receives at least one stream of baseband data accompanied by an SNR_MODE signal, the packet detect processor performing a comparison of a signal level to a signal plus noise level added to a threshold value, the signal plus noise level formed by autocorrelating the stream of baseband data with a conjugated stream and accumulating n autocorrelation values, the signal level formed by cross correlating the stream of baseband data with delayed and conjugated baseband data and accumulating n autocorrelation values, where n is increased when said SNR_MODE signal is low, or said threshold is decreased when said SNR_MODE signal is low.

SUMMARY OF THE INVENTION

A packet acquisition controller operates in conjunction with a plurality of automatic gain control (AGC) controllers and a packet detector, with each AGC controller coupled to an RF front end receiving signals and having a gain controlled by the associated AGC controller. The output of each RF front end is coupled to a corresponding analog to digital converter (ADC) for generation of a stream of signals known as RX_IQ_m, and known collectively as RX_IQ, where m is the particular stream number associated with a particular antenna, RF front end, and ADC. The AGC controller outputs a gain control signal to the RF front end sufficient for the packet detector to detect incoming low level packets by performing a window average over a comparatively large number of previous samples to establish an interpacket gain level that results in optimum use of the available dynamic range of the ADC for low level signals. The AGC controller also averages over a comparatively smaller number of previous samples to detect increases in signal energy. When an interferer or channel noise cause an increase in noise level, the AGC gain is reduced.

The packet detector has an SNR_MODE input and one or more streams of incoming baseband signals. For each stream, a signal value which is formed by correlating a baseband signal stream with a delayed and conjugated baseband-signal stream, where the output of the correlator is accumulated over n samples. If there are multiple streams, the outputs of each associated signal correlator are weighted using $C1 \ldots Cn$ coefficients to favor the strongest stream, if one is present, or to equally weight the streams if no strongest stream is present. In one embodiment of the invention, only a single strongest stream is selected by setting the associated coefficient to 1, and the other coefficients to 0. The weighted streams are then applied to the signal accumulator input. The packet detector also includes a signal plus noise value which is formed by auto-correlating a baseband stream with a conjugated baseband signal stream, where the output of the correlator is accumulated over n or more samples. If there are multiple streams, the outputs of each associated noise correlator are weighted using the same $C1 \ldots Cn$ coefficients as the corresponding stream of the signal correlator and applied to the signal plus noise accumulator input. Packet detect is asserted when the accumulated signal value exceeds the accumulated signal plus noise value by a threshold amount. The packet detector may use the SNR_MODE input to accumulate over a smaller number of samples when SNR_MODE is HIGH corresponding to one or more strong signal streams, and the packet detector may accumulate over a larger number of samples when SNR_MODE is LOW. In one embodiment of the invention, the accumulator selects the signal stream for the largest signal level and uses weight 1 for this stream, and weight 0 for the other streams. If one or more of the streams have substantially similar signal energy levels, a strongest stream may be chosen, or alternatively, the weights $C1 \ldots Cn$ may be selected to equalize the stream strengths from each autocorrelator to the accumulator.

If the packet detector issues a PACKET_DET indicating packet detection before the AGC controller detects a signal level increase in RX_IQ_m above a stream-specific threshold for any of the m streams, a "one-step AGC" operation is performed by the AGC controller whereby the signal level is adjusted based on the last signal estimate to increase or decrease the receiver gain to place the signal in an optimum dynamic range of the ADC. Following the "one-step AGC" operation, the packet acquisition controller issues an AGC_FREEZE to all AGC controllers, thereby suspending any further AGC operation.

When an increase in energy level is detected on any of the RX_IQ streams, the packet acquisition controller asserts a PD_RESET signal until the last active AGC process is completed, after which the PD_RESET signal is unasserted, thereby suspending the operation of the packet detector until the last AGC process to complete is finished. The completion of the last AGC process also starts a false packet timer such that if packet detection does not occur within a particular interval of time associated with the short interval from start of packet energy to end of preamble, thereby indicating a false packet, the AGC controllers return to seeking a gain level associated with interpacket energy level. A similar function can also be performed by a "false packet" output from the baseband processor, whereby at any point in the packet acquisition process a packet is not successfully detected by higher level demodulator stages of the baseband processor (BBP).

In this manner, at low SNR levels, the system gain level may be established from the interpacket noise level, and hence the entire preamble is available for performing robust packet detection. At high SNR levels, although a portion of the preamble is consumed during the AGC process, the resulting shorter preamble time is sufficient to ensure robust packet detection. Additionally, the AGC processor may generate an SNR_MODE signal to indicate whether the SNR of the stream applied to the packet detector is HIGH or LOW. In this manner, the packet detector can utilize the SNR level information to perform more post-correlation sample averaging in the signal and noise correlation accumulators and operate on a lower detect trigger threshold for low SNR packets when SNR_MODE is LOW, and when SNR_MODE is HIGH corresponding to strong signal level, use fewer post-correlation accumulator averages and a higher trigger threshold after the AGC process is completed for the high level signal.

One advantage of the present invention is that the packet detector sensitivity is not dependent upon AGC threshold, since the packet detector is operating on the default SNR_MODE of LOW and with a high interpacket gain level applied to the RF front ends. Therefore, a high trigger threshold can be used to generate the GT_NFLR signals of the AGC controller to indicate signal is above a particular threshold, such as in the range of 10 dB to 20 dB, with the threshold typically set to 15 dB above the noise floor, to assert GT_NFLR_m for a particular mth AGC controller. Therefore, in the case of multi-stream AGC, if particular streams exceeds the threshold, only the AGC controllers for those streams perform the AGC process. After the AGC process for those streams is completed, the associated AGC_LOCK_m for each associated mth receiver is asserted, while the other streams are still below a threshold, where the threshold is 10-20 dB, or for the best mode of the invention, is 15 dB above noise floor. As indicated earlier, in the single-strong stream scenario, the weaker streams are provided with weights of 0 and are not part of the stream generated by the packet detector autocorrelators and coupled to the corresponding accumulators for packet detection. As was described earlier for the strong signal case, packet detection operations start after the AGC process is completed.

BRIEF DESCRIPTION OF THE DRAWINGS

FIG. 5A shows a table for the selection of C1 and C2 according to indicated RX_IQ stream signal strength.

FIGS. 10A and 10B show a flowchart for one embodiment of the AGC processor and packet acquisition controller.

DETAILED DESCRIPTION OF THE INVENTION

Figure 3:
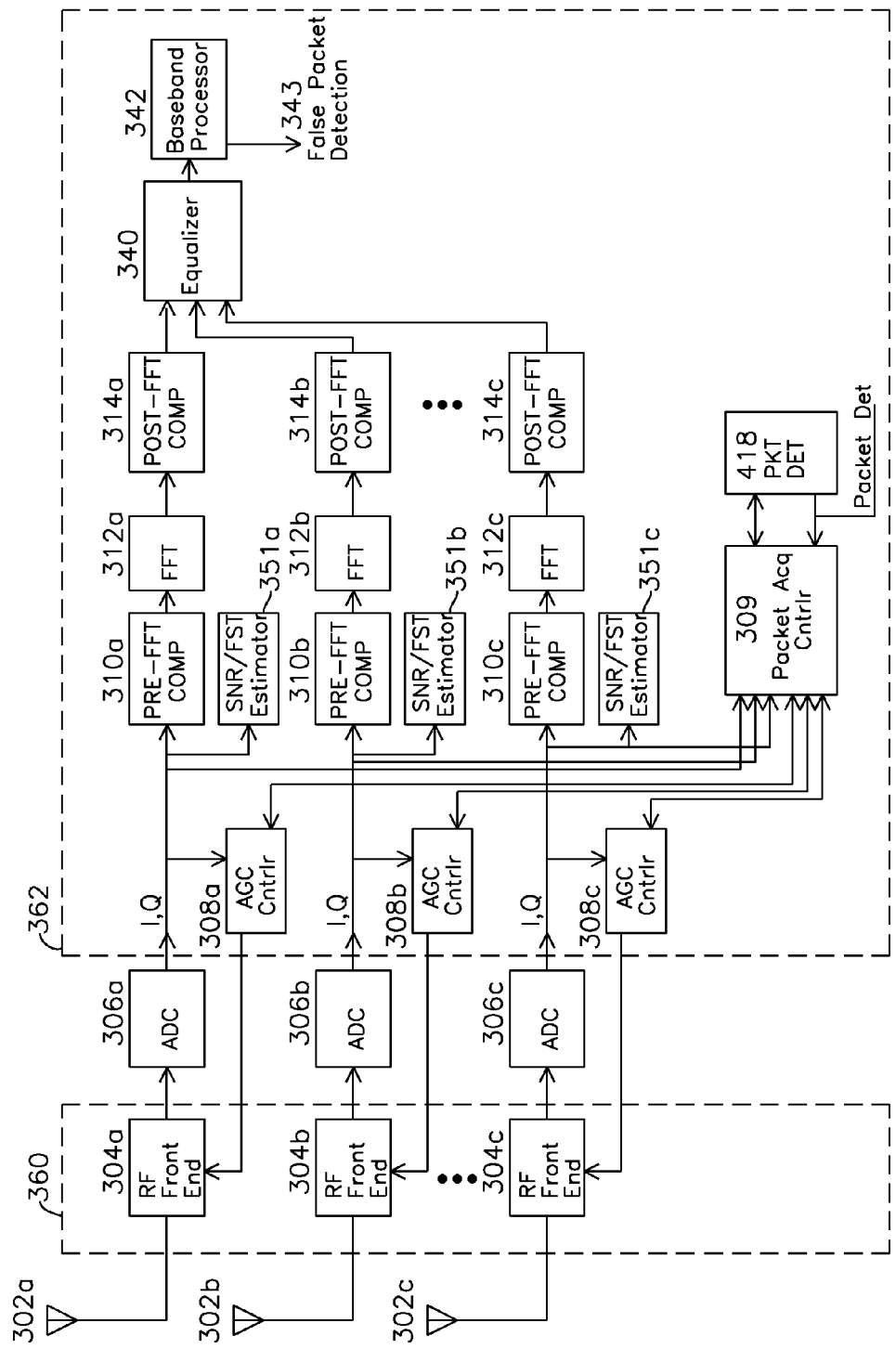
FIG. 3 shows a block diagram for a signal processor including a packet detector controller, a packet detector, and an AGC controller according to the present invention in the overall context of a receiver.

FIG. 3 shows a wireless receiver including an RF front end 360, analog front end (AFE) including analog to digital converters (ADC) 306a, 306b, 306c, and baseband processor 362 including AGC controllers 308a, 308b, 308c and packet acquisition controller 309 coupled to packet detector 418. Following a single processing stream in one embodiment of the invention shown for OFDM or OFDMA modulated wireless packets, a signal is received at antenna 302a, which is coupled to RF Front End 304a, which accepts a gain control input from AGC controller 308a and has an output coupled to analog to digital converter 306a. The ADC 306a generates a quadrature stream of baseband signals referred to as RX_IQ_1 which are input to AGC controller 308a, which adjusts the gain of the RF front end 304a according to the level of the ADC output level. One example of an AGC controller suitable for use in the present invention is described in U.S. patent application Ser. No. 10/934,275. During the initial preamble reception interval, the AGC levels are set by AGC controller 308a, which for high level incoming signals also asserts an AGC_LOCK signal after the AGC process has completed.

Figure 11A:
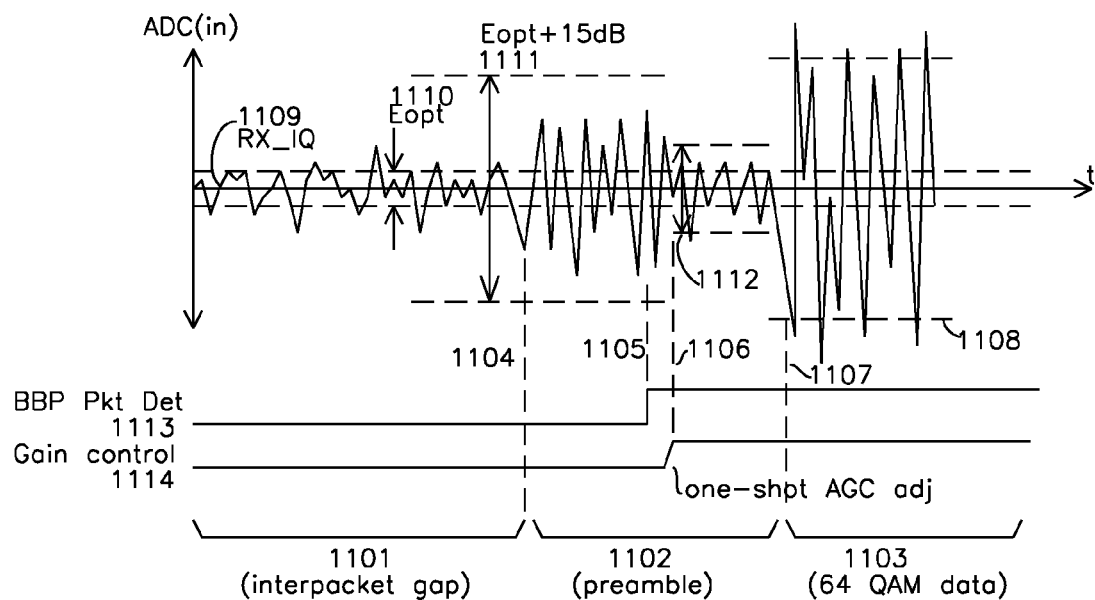
FIG. 11A shows a time diagram for an RX_IQ with a preamble.
Figure 11B:
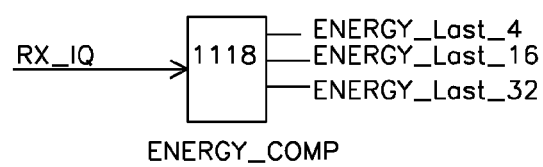
FIG. 11B shows a block diagram for an energy comparison circuit for use with automatic gain control.
Figure 11C:
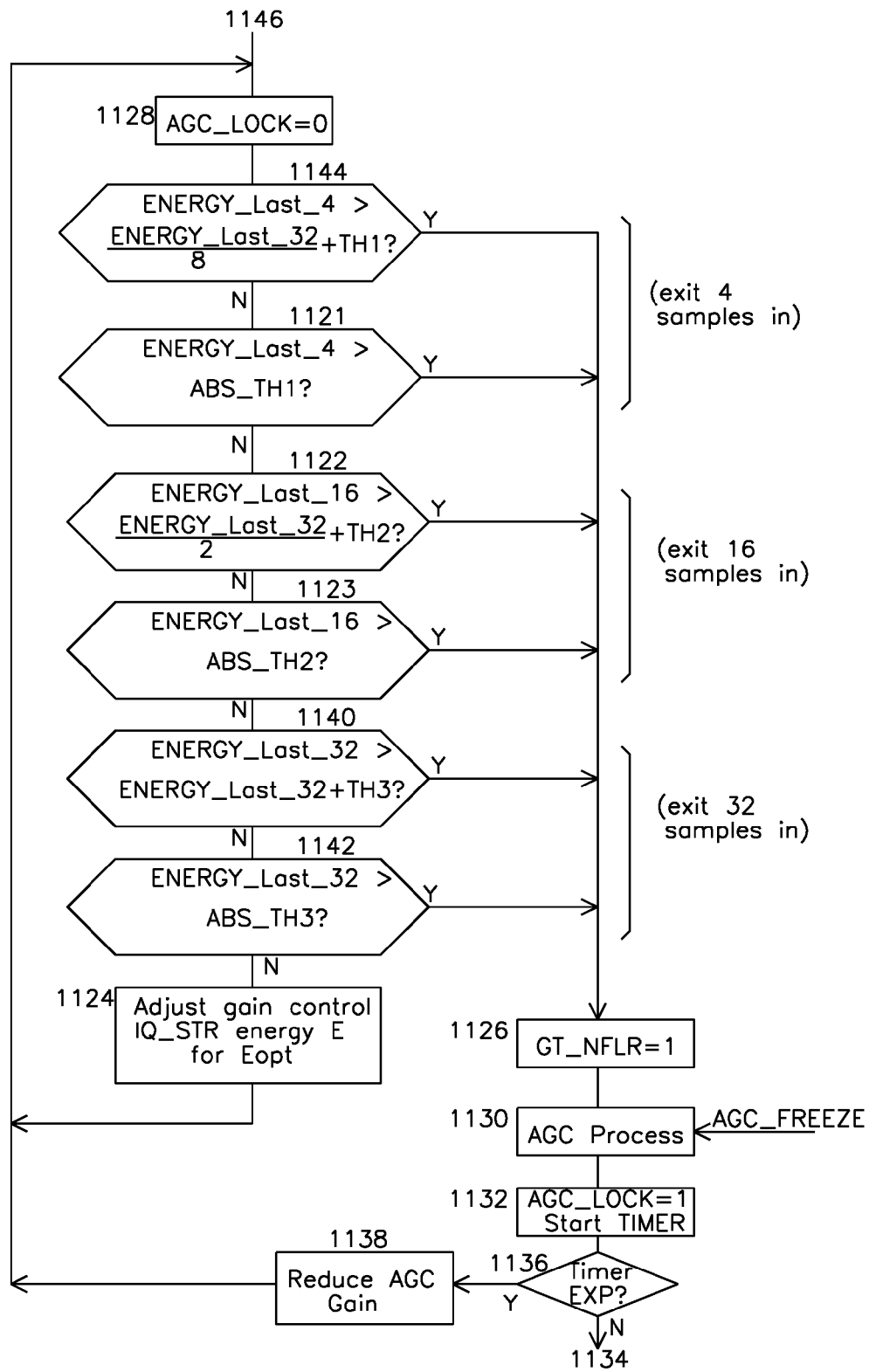
FIG. 11C shows a process flow for automatic gain control process.

One example AGC controller which includes energy detection and responsive to an input signal AGC_FREEZE is shown in FIGS. 11A, 11B, and 11C. The RX_IQ such as output of ADC 306a of FIG. 3 is fed to a detector 1118, where the most recent 32 samples have an energy computation performed for each set of samples by energy computation 1118, such that the average energy of the previous 4 and 16 samples can be compared to the average energy of the previous 32 samples, or any other previously saved energy level. The process of FIG. 11C illustrates this operation, where at entry point 1146 with AGC_LOCK=0 1128, the energy of the previous 4 samples is relatively compared to a scaled previous 32 samples plus a first threshold TH1, which may correspond to 10 dB or 15 dB, as described previously, and then an absolute threshold comparison is performed against ABS_TH1 1121. If the previous 4 samples show an energy increase from the relative 1144 or absolute 1121 comparisons, GT_NFLR is asserted in step 1126. Similarly, if the relative energy of the previous 16 samples is greater than the scaled energy of the previous 32 samples by a second threshold 1122, or the absolute energy of the previous 16 samples is greater than ABS_TH2 1123, the process exits and GT_NFLR is asserted in step 1126. If the relative energy of the last 32 samples is greater than a third threshold 1140, or the absolute energy of the last 32 samples exceeds a absolute threshold ABS_TH3 1142, the process exits and GT_NFLR is asserted in step 1126. The advantage of examining for a large energy increase such as 15 dB on a small number of samples provides an early indicator for the packet detect circuit, which may also operate selectively on high signal packets using the SNR_MODE input to indicate signal strength. If an energy level increase is not detected, process 1124 adjusts the interpacket gain level to place the noise in an optimum energy level Eopt. If the signal energy is sufficiently large for the process to enter step 1126, the AGC process 1130 is executed, after which AGC_LOCK is asserted 1132. The assertion of AGC_FREEZE input to process 1130 causes the AGC process to immediately stop and exit to step 1132.

FIG. 11A shows example packet reception in one embodiment of the invention where the incoming signal level 1109 is below the 15 db threshold 1111. Interval 1101 indicates an interpacket gap, 1102 indicates a preamble interval, and 1103 indicates a data part of the packet, such as the worst case example of a 64-QAM data packet, where the 12 dB peak to average power allowance required to maintain 64-QAM modulation Error Vector Magnitude (EVM) of 12 dB. During interpacket gap interval 102, the AGC gain control adjusts the RX_IQ signal level 1109 entering the ADC to Eopt 1110. At time 1104, the preamble interval 1102 starts, and the signal level accordingly increases beyond the extents of Eopt 1110, but below the 12-15 db greater than interpacket signal level shown as 1111. The baseband packet detection 1113 is asserted, which starts the one-shot AGC correction 1114 at time 1106. The one-shot gain correction reduces the gain of the system to place the preamble signal level Vrms 1110, and less than an AGC correction inaccuracy range such as the example shown of Eopt+3 db 1112, or Eopt+/−3 db (lower limit not shown). Packet reception continues until time 1107 when the data interval of the packet 1103 begins, which packet modulation PAPR accordingly increases the signal level to level 1108, within the linear dynamic range of the ADC. In this manner, packet detection which occurs before the threshold 1111 detect results in the generation of one-shot AGC 1114 providing a signal level which affords optimal signal level operation for the baseband processor receiving the digitized RX_IQ signal after AGC correction according to the present invention. The derivation of Eopt_packet may be done several different ways, and one such value is Eopt_packet=Efull−15 dB=−18 dB Other example derivations of Eopt_packet will be described later.

Figure 12A:
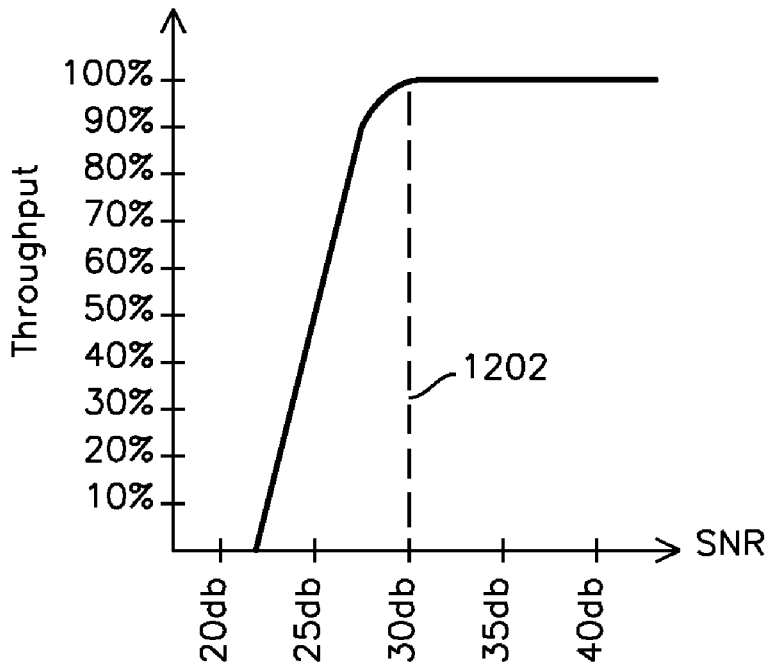
FIG. 12A shows a plot for throughput versus SNR for 64-QAM modulation.

As an example for a particular system, the ADC budget for 54 MBps (64-QAM modulation) in a 10 bit ADC is 53-57 dB SNDR (signal to noise and distortion ratio), less 12 dB peak to average power ratio (PAPR) for 64-QAM. This leaves a 41-46 dB SNDR from the ADC, and if a 3 dB margin is provided to accommodate AGC inaccuracy, the remaining SNDR for 64-QAM in a 10 bit ADC is 38-43 dB SNDR. FIG. 12A shows throughput versus SNR for 64-QAM, showing 30 dB SNR for an acceptably high throughput of 99.99%. The 30 dB SNR requirement for acceptable operation of 64-QAM combined with the 38-43 dB SNR introduced by ADC quantization (and using the value 40 dB for simplicity) results in an overall SNDR of 29.5 dB at the ADC output. This translates into an implementation loss of less than 0.5 dB. The above analysis is essentially unchanged whether the packet is WLAN or WiMAX type.

Figure 12B:
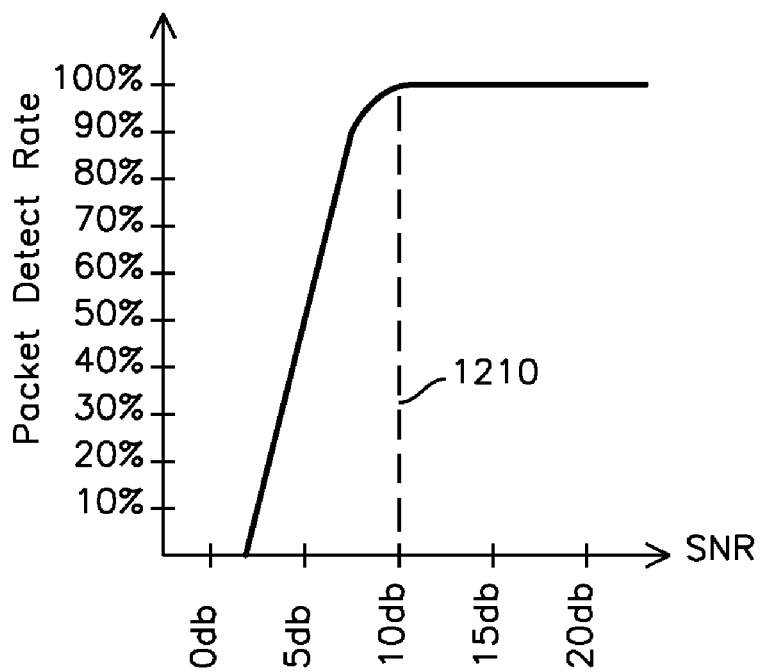
FIG. 12B shows a plot for packet detect versus SNR for a preamble modulation such as a Barker code.

Performing the same budget calculation for the preamble and inter-packet interval, the ADC budget is 53-57 dB SNR for 10 bit ADC quantization, and for systems which can also switch to an 8 bit ADC quantization, such as the system described in U.S. patent application Ser. No. 11/515,314, the contents of which are incorporated herein by reference, the SNDR is 12 dB lower for the 8 bit quantizer mode operating during preamble interval, or 41-45 dB. Allowing for 6 dB PAPR associated with typical preamble modulation techniques in the presence of multipath reflection, the SNDR due to ADC quantization is 35-39 dB. The AGC inaccuracy for lower level signals is 12-15 dB, leaving a minimum 20 dB SNR due to quantization for incoming preamble signals. FIG. 12B shows that the packet detect rate for the packet detector of FIG. 5 (described later) is essentially 100% above 10 dB SNR, and since the available Signal to Quantization Noise Ratio (SQNR) is 20 dB it will degrade the performance of the packet detector of FIG. 5 by less than 0.5 dB (which is the implementation loss budget for the ADC) The remaining threshold to determine for the present example is the threshold for which GT_NFLR_1 and GT_NFLR_2 are asserted, which may be 12-15 dB above the noise floor value. This allows an AGC inaccuracy of 12-15 dB, as was used in the above ADC budget analysis, showing that the implementation loss can be kept to less than 0.5 dB even with such a large AGC inaccuracy due to the inherently low SNR of operation of the packet detection process.

Summarizing the operation of the signal level threshold detection of the present invention as described in FIGS. 6, 7, 8, 9, 10A, 10B, 11A, 11B, and 11C, and the operation of the AGC processor which is setting signal levels to the baseband processor, it can be seen that:

For low level packets which fall below the 12-15 dB threshold, the power level at packet-detection input would directly vary proportional to SNR, which implies the power levels will vary by 12 to 15 dB. To fully understand why power level inaccuracy of 12 to 15 dB is acceptable for packet-detection but not acceptable for 64-QAM data-decoding the ADC Quantization noise Budgets for both cases described earlier are reiterated in this context:

The first objective is to keep the implementation loss due to ADC quantization noise to less than 0.5 dB in all phases of operation, as follows:

During the 64-QAM data-demodulation phase, the requirement for "SNR for peak performance" (30 dB) and PAPR (12 dB) are tighter and hence the margin possible for AGC inaccuracy should to be kept to less then 2 to 3 dB typically.

During Packet-detection phase, the "SNR for peak performance" (10 dB) and PAPR (6 dB) are less important constraints on system operation, since the packet detection operates over a greater range of signal levels. Therefore the margin possible for AGC inaccuracy can be increased to 12 to 15 dB, which is the motivation for the selection of the threshold level.

It should be also noted that although the overall relaxation between 30 dB to 10 dB and 12 dB to 6 dB is 20+6=26 dB, it is not possible to increase the AGC inaccuracy allowance by this amount. The motivation for preserving the AGC inaccuracy is for certain configurations such as those described in applicant's co-pending U.S. patent application Ser. No. 11/515,314, and incorporated herein by reference, is that in the inter-packet interval, for the purpose of "power-saving", the ADC is switched to a lower resolution, such as 8-bit mode, and hence 12 dB is lost during this power savings mode. Therefore, leaving 26 dB−12 dB=14 dB as the margin by which AGC inaccuracy can be increased is the preferred embodiment for dual resolution ADC devices. Therefore, for an ADC which reduces quantization levels by a factor of 4 during the interpacket gap interval, the 12 to 15 dB threshold level should be maintained.

With regard to the ADC input dynamic range, ADC full range is defined as Efull, which for the present example is 1V peak to peak (pp). For a 1V pp sinusoid, a typical ADC provides SQNR of 55 dB in 10-bit mode. The value for Energy (normalized Vrms) for a 1 Vpp sinusoid is −6 dB Vrms. This is a measurement of energy only on the I channel of the two channel IQ ADC. The total energy on both channels is therefore 3 dB above this, or Efull is −3 dB Vrms.

The derivation of Eopt_for 64-QAM implementation loss budget can be described as follows:

It is required that the signal level to be at least 40 dB above the ADC quantization noise so that packet SNR due to ADC quantization noise is 40 dB. This ensures that even at high SNRs of 30 dB the implementation loss due to ADC quantization noise is less than 0.5 dB. Therefore Eopt_packet= Efull (−3 dB Vrms)−15 dB=−18 dB Vrms, where 15 db is the difference between 55 db SQNR and 40 db of ADC quantization noise.

It should also be noted that the above 15 dB is allocated as 12 dB PAPR (for 64-QAM packet), resulting in 2-3 dB AGC inaccuracy.

Eopt for inter-packet noise can then be derived using "allowance for GT_NFLR", preamble PAPR & noise averaging inaccuracy (which depends on amount of averaging to determine noise power) as follows:

Eopt (inter-packet noise)=Efull (−3 dB Vpp)−15 dB (allowance for GT_NFLR)−6 dB (preamble PAPR)−6 dB (noise averaging inaccuracy)=−30 dB Vrms. We note that the combined allowance for GT_NFLR, Preamble PAPR, and noise averaging inaccuracy form a 27 dB loss.

The 15 dB allowance for GT_NFLR can be increased, but the limit of this increase is the "ADC implementation loss budget" for the Preamble-detect (for which performance at 10 dB SNR should not degrade by more than 0.5 dB). That means at 10 dB SNR of preamble, the SQNR should be maintained at a minimum of 20 dB.

For the case where a dual-resolution ADC is switched from 10-bit mode to 8-bit mode in inter-packet regions, the SQNR for input equal to Efull is approximately 42 dB (approximately 12 dB less than the normal 10 bit mode described earlier because of the loss of 2 A/D bits in 8 bit mode compared to 10 bit mode). This implies that for Efull (42 dB) less 27 dB loss described earlier, the SQNR is 15 dB. It was also described that inter-packet thermal noise is set by the AGC system to Efull (42 dB) less 27 dB=15 dB. Therefore, a preamble for 10 dB SNR will be at Efull (42 dB SQNR) less 17 dB producing an associated SQNR of 25 dB, which 25 dB is in excess of the 20 dB requirement. This is the justification for setting the GT_NFLR threshold to as high as Eopt+15 dB.

Returning to FIG. 3, after the AGC process and packet detection, the channel estimator for each channel such as 351a extracts the H matrix channel response for that channel, and during the same interval the H matrix is being extracted, a symbol timing and packet detection processor is performing a convolution of the received preamble with a delayed conjugated copy of the received preamble, and searching for a correlation increase indicating start of packet within the preamble. One example of a packet detection and symbol timing detector suitable for use in step 1130 of FIG. 11C is described in U.S. patent application Ser. No. 10/934,276, now issued as U.S. Pat. No. 7,298,772. The received stream of IQ data at the output of the ADC 306a is provided to PRE-FFT compensation 310a, after which an FFT is performed 312a to extract the associated subcarriers, which subcarrier values are compensated 314a on a per-subcarrier basis using per-subcarrier values generated by the channel estimator 351a. Each stream of data is similarly processed as shown in 310b, 312b, 314b, and 310c, 312c, 314c, all of which are provided to equalizer 340, which may be any function which improves symbol detection, such as a MIMO equalizer coupled to an LLR detector for MIMO streams. The output of the equalizer 340 is applied to a baseband processor according to the prior art, and an important signal generated by the baseband processor 342 is a false packet detection output 343, which is used by the packet acquisition controller 309 to initialize the packet acquisition sequence after a packet detect which is not associated with a valid packet as demodulated by the baseband processor 342. While the baseband decoder of FIG. 3 is specific to OFDM modulations, such as are used in IEEE 802.11, 802.11a, and 802.11g (high data rate OFDM), and 802.11e for OFDMA, similar baseband processing which relies on the generation of packet detect based on a repeated preamble may be used for other wireless protocol without loss of generality.

Figure 4:
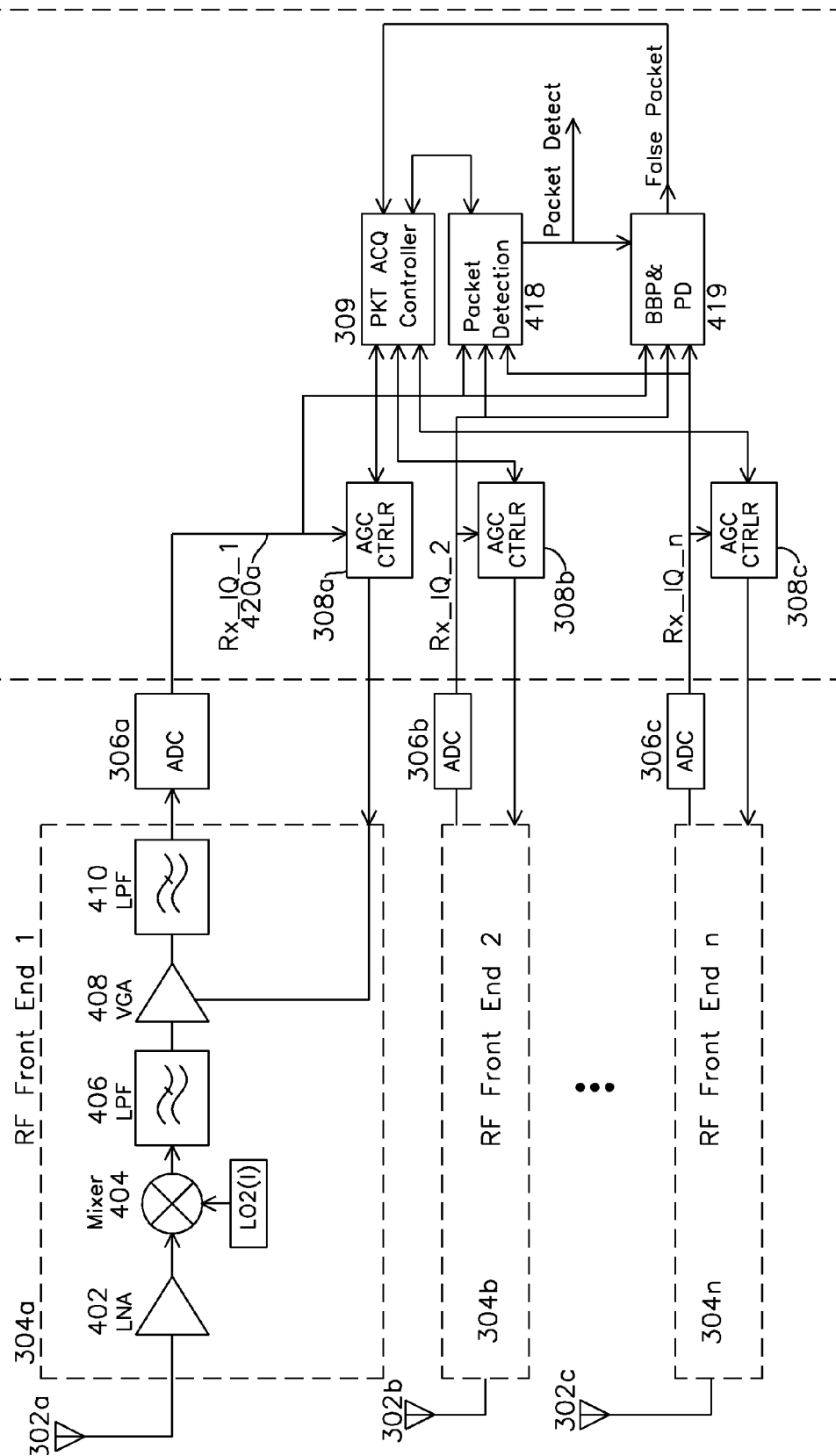
FIG. 4 shows the block diagram for a MIMO wireless receiver with an AGC processor and an AGC/packet acquisition controller.

FIG. 4 shows the elements of the invention in a more general configuration, comprising a plurality of gain-programmable RF front ends 304a, 304b, 304n, each generating a quadrature output and coupled to an I and Q ADC 306a, 306b, 306n, and responsive to an AGC controller 308a, 308b, 308n, such as the one described for FIGS. 11B and 11C. Packet detection 418 may be any prior art packet detection system which accepts one or more streams of data to generate a packet detect output, including the one described in U.S. Pat. No. 7,298,722, which may be coupled to a single RX_IQ stream of incoming preamble symbols, or adapted to couple to a plurality of such RX_IQ streams. The Packet acquisition controller 309 provides AGC_FREEZE to the AGC controllers 308a, 308b, 308c, and the packet detect controller 418 is coupled to the RX_IQ streams which have either been set to an Eopt level based on noise power for the case of low signal packets, or have completed AGC process for the case of high signal level packets sufficient to have asserted GT_NFLR for a particular channel. False packet detect from the baseband processor 419 such as signal 343 of FIG. 3 is applied to the packet acquisition controller 309 of FIG. 4.

Figure 5:
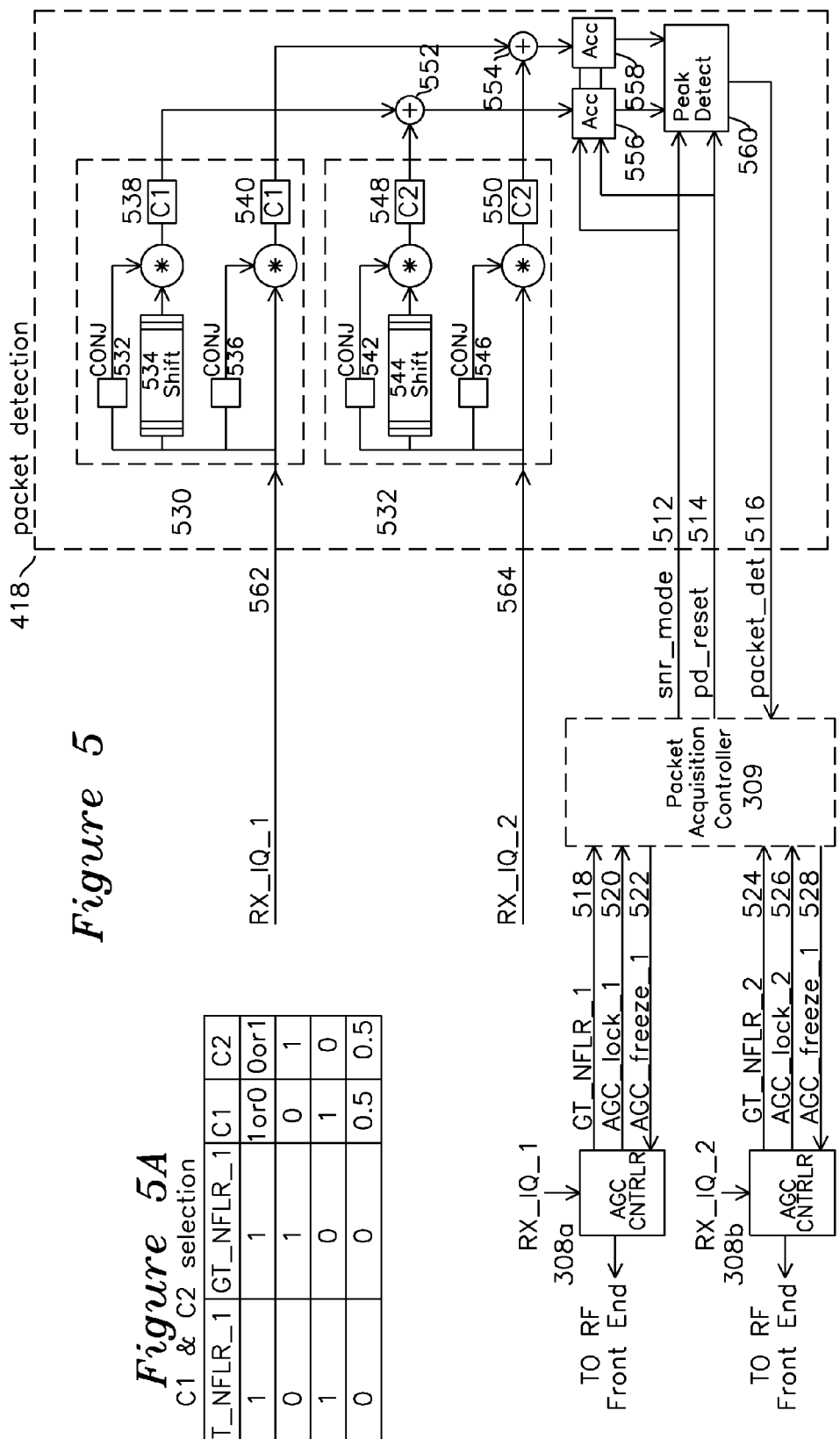
FIG. 5 shows a block diagram of a packet acquisition processor coupled to an AGC controller and a packet detector.

FIG. 5 shows the detailed relationship between the functional blocks in one example embodiment of the invention. AGC controller 308a generates the gain control value for an associated RF front end by examining the IQ data at the output of the ADC for a particular stream, shown in the present example as the first stream from FIG. 4, and as was described in FIGS. 11B and 11C. The AGC controller 308a initially generates an inter-packet gain control level which produces a sufficiently high RF front end gain level for the ADC outputs to be quantizing noise and accommodate packet detection and baseband demodulation of low level incoming packets, during which time GT_NFLR_1 is not asserted, indicating that the incoming RX_IQ_1 has not exceeded a threshold level, and a gain control value based on inter-packet noise sufficient to achieve Eopt as described for FIG. 11A is generated by AGC controller 308a. A signal indicating "greater than the noise floor by delta" where delta is a value such as Vth1 or Vth2 as was described for FIGS. 11B and 11C referred to as GT_NFLR_1 is asserted upon the detection of a signal level from IQ stream RX_IQ_1 which exceeds the noise floor level by some increment delta, which may be 15 db, or any level sufficient to indicate an incoming signal level increase. When an increased IQ stream power level above a noise floor by the increment delta is detected, the GT_NFLR_1 signal is asserted, and the AGC process begins, which adjusts the gain control to the RF Front End such that the RX_IQ_1 is within a suitable dynamic range of the ADC, as indicated by the RX_IQ_1. During the AGC process, the PD_RESET signal is asserted, which indicates to the packet acquisition controller that packet detection is to be suspended during the AGC interval. The motivation for suspending packet detect during the AGC process is that the RX_IQ_1 data may be saturated and non-linear, possibly producing a false packet detect by the packet detector 418. The AGC controller 308a is also responsive to an AGC_FREEZE_1 signal, which suspends any AGC process that may be occurring, and is typically asserted for the duration of the received packet. The packet detect controller 418 accepts all of the streams of IQ data provided to the AGC controller, shown for the case of two streams RX_IQ_1 and RX_IQ_2.

FIG. 5A shows the selection of coefficients C1 and C2 for various stream signal strengths as indicated by GT_NFLR_1 and GT_NFLR_2. In a first low signal level mode where GT_NFLR_1 and GT_NFLR_2 are unasserted, the packet detect controller 418 has equal stream weights C1 and C2 on all incoming correlator outputs which sum 552, 554 into signal accumulator 556 and signal plus noise accumulator 558, which are each coupled to a peak detect 560 which compares signal accumulator 556 output with the signal plus noise accumulator 558 output. Upon detection of a peak, packet detect 516 is asserted, which causes packet acquisition controller 309 to assert AGC_freeze 522, 528 to each AGC controller 308a, 308b. As GT_NFLR_1 or GT_NFLR_2 are not asserted, the SNR_MODE is set to LOW, which results in a longer window for accumulators 556 and 558 than when SNR_MODE is set to HIGH, and also results in a lower peak detect 560 threshold value. In this first mode, the packet detector is searching for low-level preambles, which mode is entered when PACKET_DET is asserted as for a low level signal prior to GT_NFLR_1 or GT_NFLR_2.

In a second mode for high level signals, the packet acquisition controller 309 receives at least one of GT_NFLR_1 or GT_NFLR_2 as asserted from an associated AGC controller 308a, 308b, indicating that one or more streams is a strong signal. In this mode, the PD controller 309 asserts PD_RESET 514 indicating that the packet detector 418 should suspend packet detection until AGC is completed, as indicated by AGC_LOCK_1 or AGC_LOCK_2 from the corresponding AGC controller 308a, 308b. The packet acquisition controller 309 also asserts SNR_MODE as HIGH, indicating to the packet detect controller 418 that a high signal level is being received. When the last AGC_LOCK is released from a controller asserting an associated GT_NFLR, PD_RESET is unasserted, indicating that the packet detector 418 may begin searching for start of packet by preamble delayed correlation, and using SNR_MODE as HIGH. Additionally, the packet detect controller 418 selects the correlators associated with the strongest stream, and sets the corresponding weight C1 or C2 for that stream to 1, and sets the correlator output weights for the weaker streams to 0. If all streams are equally strong, an arbitrary selection of stream is made by setting that stream such as C1 to 1, and the other stream to 0, or conversely setting C1 to 0 and the other stream to 1, as shown in the table 5A. In this second mode, if GT_NFLR (or optionally AGC LOCK) signal is asserted, a timer is started to detect "false packets" where a false trigger for GT_NFLR has occurred. The timer is set to expire in the relatively short time period from start of packet to expected end of preamble, and if the timer expires before the assertion of PACKET_DET, such as for reception of noise or an interferer, the AGC gain level for the related AGC controller 308 is decreased, as was described in FIGS. 11B and 11C.

The packet detect 418 is one example of a possible packet detect circuit, and is only included for completeness in understanding the present invention as it relates to the use of SNR_MODE in a packet detector. The correlated signal accumulator 556 and signal plus noise accumulator 558 average more samples over a longer window when SNR_MODE is LOW and fewer samples when SNR_MODE is HIGH. The signal accumulator 556 is fed by a series of weighted streams of signal correlator outputs, each correlator output representing the correlation of a shifted 534 stream with a conjugated 532 stream, where the amount of shift 534 is equal to a symbol time. The signal plus noise accumulator 558 is fed by a series of weighted streams of signal plus noise correlator outputs, each correlator output representing the correlation of an RX_IQ stream with a conjugated 536 RX_IQ stream. The level of the correlation peak will also be related to the incoming stream SNR, and the peak detection may be modified by SNR_MODE input such that a higher threshold is expected when SNR_MODE is HIGH than when it is LOW. The packet detect 418 may have a PD_RESET 514 input which suspends the operation of the packet detector, for example by clearing the contents of the accumulators 556 and 558, or by holding the peak detect 560 in reset.

Figure 6:
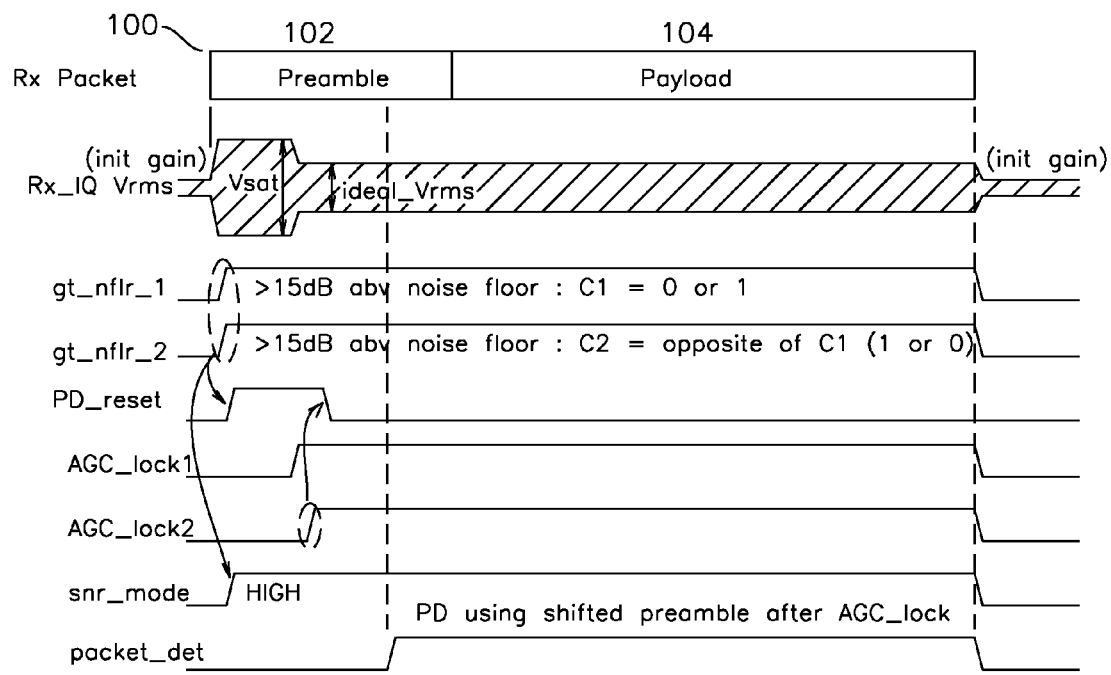
FIG. 6 shows the operation of an AGC processor and packet acquisition controller for two high signal level streams.

FIG. 6 shows the waveforms for the case where both input streams RX_IQ_1 and RX_IQ_2 are high levels. Packet 100 preamble 102 is received with the AGC set to an initial gain value based on optimum noise power Eopt, and the high incoming signal value results in the saturation of the Rx ADC stream, shown as Vsat. Upon detection of GT_NFLR_1 or GT_NFLR_2, PD_RESET is asserted, which prevents the packet detector from erroneously detecting a packet during the saturation interval and until the release of AGC_LOCK associated with the last stream to complete AGC, shown in AGC_LOCK2, which releases PD_RESET as shown. The packet detector asserts PACKET_DET during the preamble interval, as shown. The AGC controller 308a tracks the noise and interference power at the antenna and applies sufficient AGC gain control to provide a desired level at the ADC output, which may be referred to as the ambient noise/interference floor threshold. During each inter-packet interval, the AGC controller adjusts the gain to accommodate any changes in the ambient noise floor due to incoming interference or ambient noise/interference floor changes due to the incoming packet.

Once the AGC process of controller 308a begins, the range of possible power levels at the end of the process, as noted by AGC_LOCK, is large. In the best mode, a binary search method is employed for the first two or three steps of AGC, as described in U.S. patent application Ser. No. 10/680,620. During the AGC process of controller 308a, packet detection logic 418 is suspended through the assertion of PD_RESET 514. Once the AGC controller 308a is completed with the AGC process which places digitized signal energy within the desired window, AGC_LOCK 520 is asserted, after which PD_RESET 514 is unasserted. As was described earlier, the SNR_MODE 512 can be asserted for use the packet detector to indicate that a high signal level is being provided, which may be useful to the packet detector where the packet detector signal processing is able to take advantage of the increased signal to noise ratio.

Figure 7:
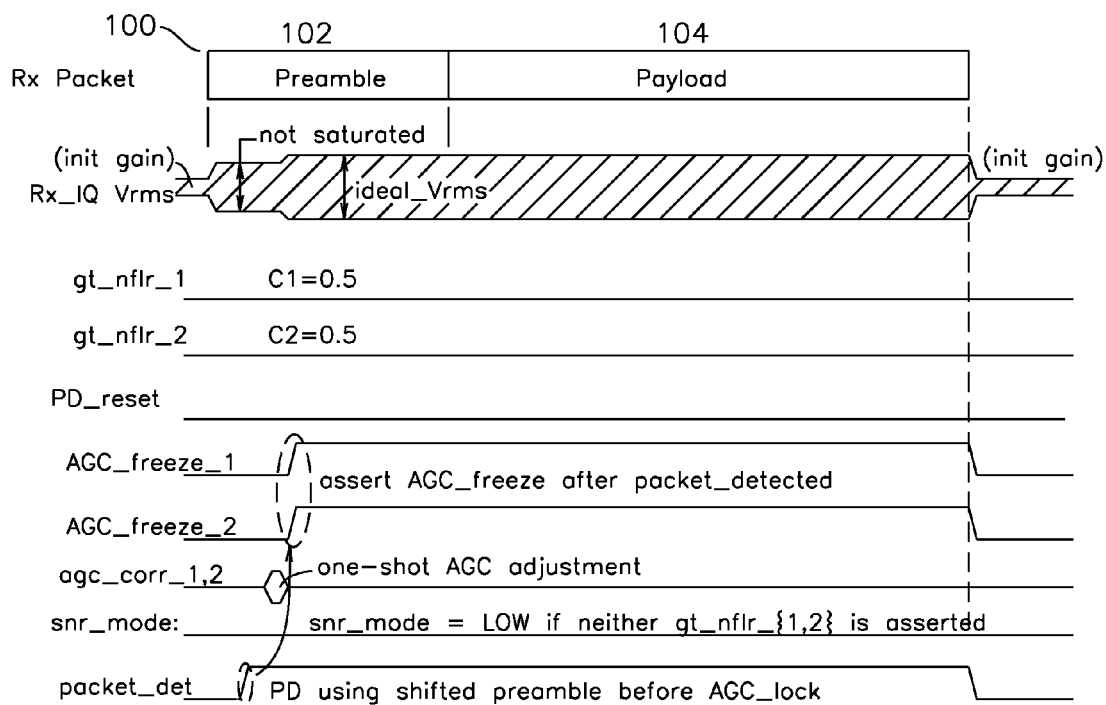
FIG. 7 shows the operation of an AGC processor and packet acquisition controller for two low signal level streams.

FIG. 7 shows the timing diagram for Low Signal Power Packet Acquisition, where an initial gain level is provided by the AGC, and the power level of the preamble is insufficient to trigger GT_NFLR_1 or GT_NFLR_2. In this case where low signal power is present on both receive streams, the AGC processor is unaware of the incoming packet, and the gain level is unchanged from that established by the optimum noise power Eopt at the ADC. For low-SNR modes (signal is less than 15 dB above the noise floor), the AGC doesn't change value from the inter-packet gain and the SNR_MODE 512 is applied as LOW to the packet detection 418, which responds by increasing the number of accumulator 556, 558 averages and reducing the peak detect comparison 560 threshold, thereby providing improved packet detection at low SNRs, as indicated by the SNR_MODE 512. When the packet detector 418 detects a preamble, an AGC_CORR is made using the "one step" AGC method described earlier, where a measurement of signal level is made, and a single adjustment is done to get the signal level closer to the target level as described earlier in the ADC budget example. After the "one step" AGC correction is completed, the controller suspends any further AGC changes through the assertion of AGC_FREEZE as shown in the timing diagram, and the remainder of the packet is processed at the initial gain level.

Figure 8:
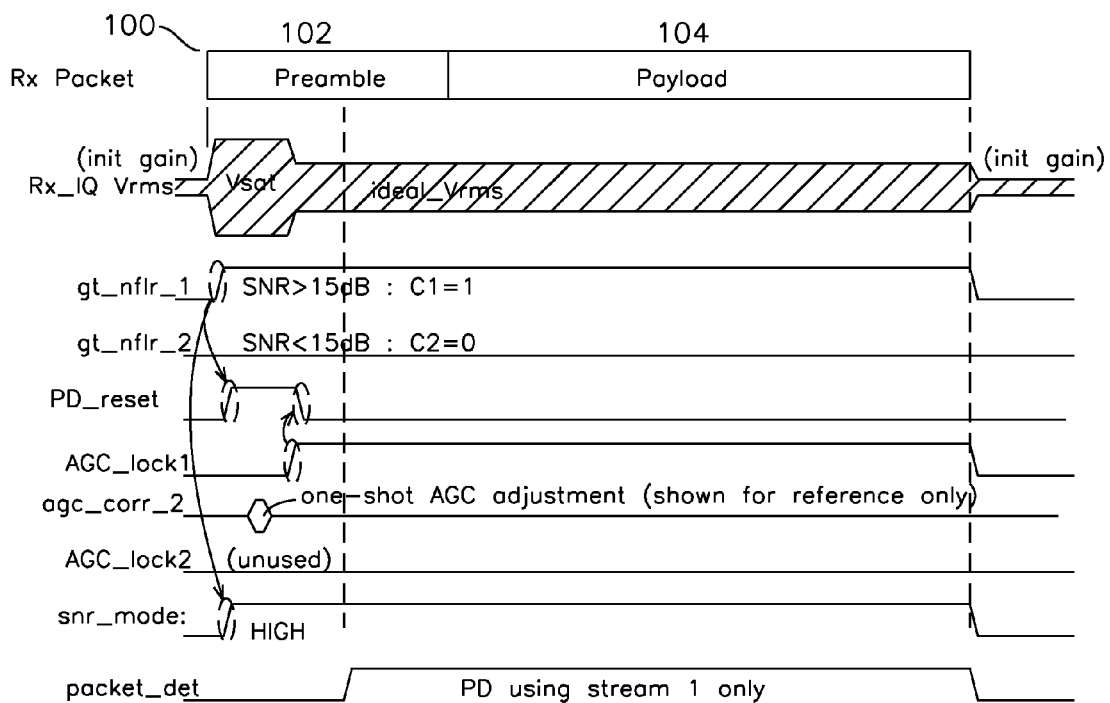
FIG. 8 shows the operation of an AGC processor and packet acquisition controller for a mixed stream of high signal level and low signal level streams.

FIG. 8 shows the timing diagram for Packet acquisition when one stream such as stream 1 receives high signal power and the other stream such as stream 2 receives low signal power. Upon onset of high power signal at the antenna associated with stream 1, the AGC processor of that stream comes out of inter-packet state and tries to acquire the new energy level, which may be an actual packet or interference. As before, GT_NFLR_1 is asserted to indicate an increased energy level is present on that channel, and PD_RESET is asserted to prevent the packet detector from erroneously detecting packet while AGC is not settled, or when the signal is saturated. After completion of the AGC process, AGC_LOCK is asserted for the channel with a strong signal, and that stream is selected for use by the packet detector in detecting start of packet. This is accomplished by setting the associated packet detector correlator output weighting coefficient C1 or C2 to 1 for the associated strong stream, and the coefficient associated with the weaker streams to 0. The one step AGC correction is shown for reference in FIG. 8, although the associated C2 coefficient is set to 0 for this weaker stream, which is therefore not used for packet acquisition. The packet acquisition controller 309 also asserts SNR_MODE=HIGH to indicate that the packet detector is operating on a high SNR stream, so it may use less averaging in accumulators 556 and 558, and an increased threshold in peak detector 508, based on SNR_MODE 512.

Figure 9:
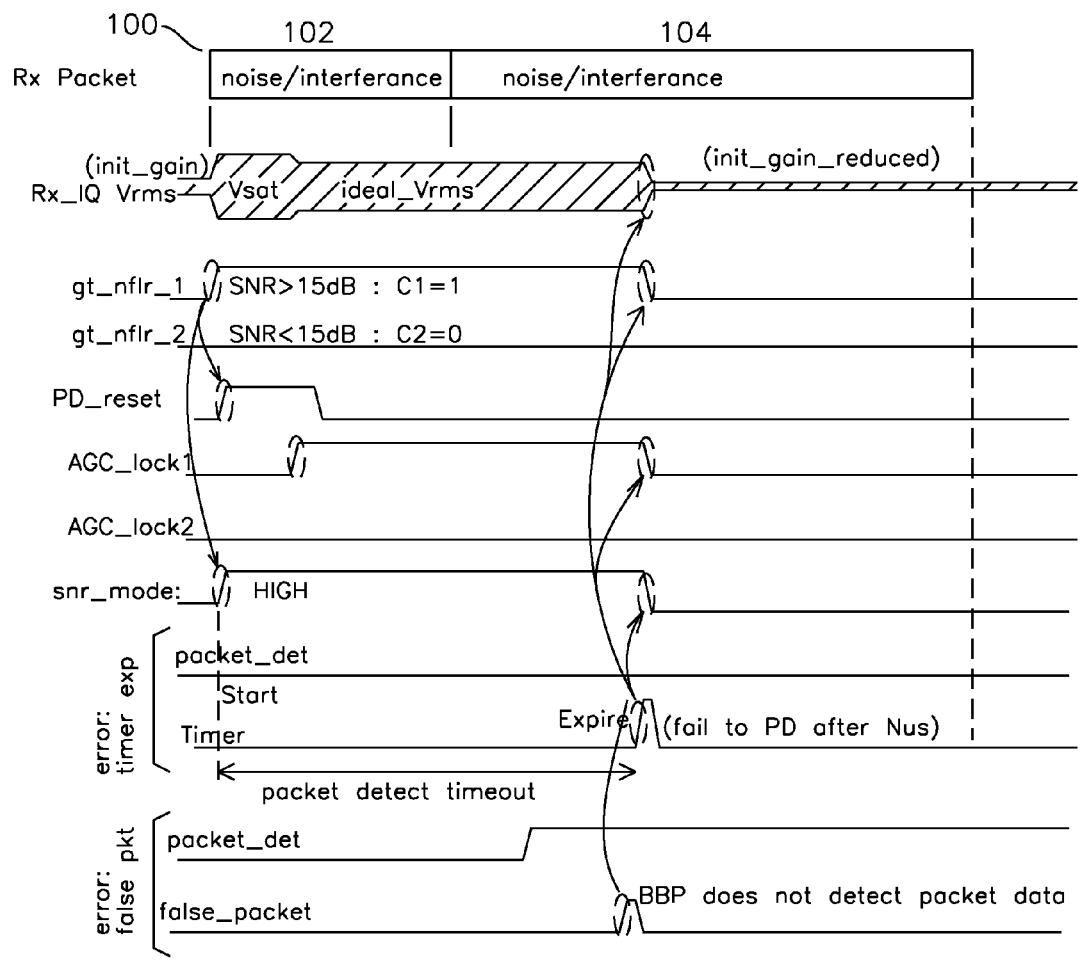
FIG. 9 shows the operation of an AGC processor and packet acquisition controller for a false packet trigger response.

FIG. 9 shows the timing diagram for packet acquisition with false packet detection. In this scenario, an interferer or noise causes the AGC controller to detect an increase in signal level, indicated as GT_NFLR_1 assertion, which causes the SNR_MODE to be HIGH and PD_RESET to be asserted, as before. Upon the assertion of GT_NFLR_1, a timer is started. When the AGC process completes, as indicated by AGC_LOCK1, PD_RESET is removed. If no PACKET_DET is asserted by the packet detector after a packet detect timeout interval, as evidenced by a timer expire shown in the timer expiration waveforms, the PD controller places the AGC controller and SNR_MODE back into the initial state associated with waiting for a packet. When the timer has triggered indicating a false packet, the AGC gain level may be reduced. An alternate scenario is shown for a false packet, where packet_det is asserted, but the baseband processor does not detect a subsequent packet and asserts an output false_packet, which causes a reinitialization of the packet detector as occurred for the case described earlier for timer expiration.

Figure 1:
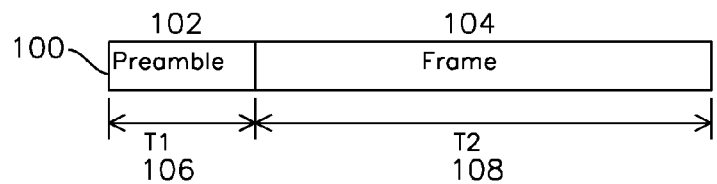
FIG. 1 shows a time diagram for a prior art wireless packet.
Figure 2:
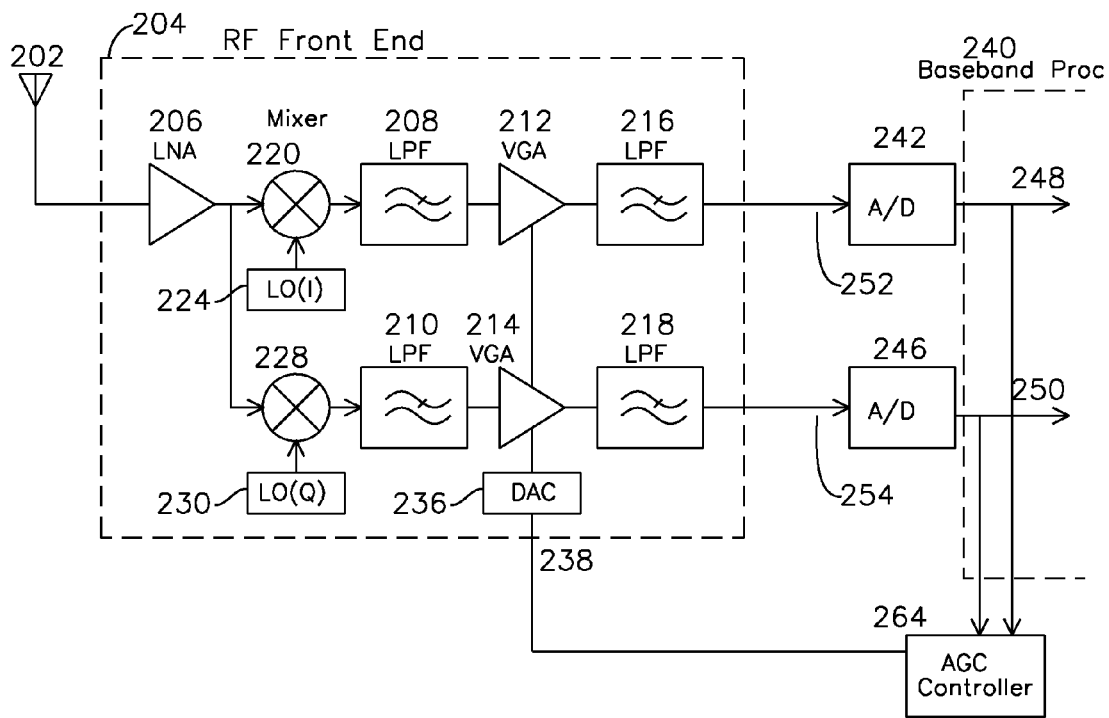
FIG. 2 shows a block diagram for a prior art wireless receiver, baseband processor, and AGC controller.
Figure 10B:
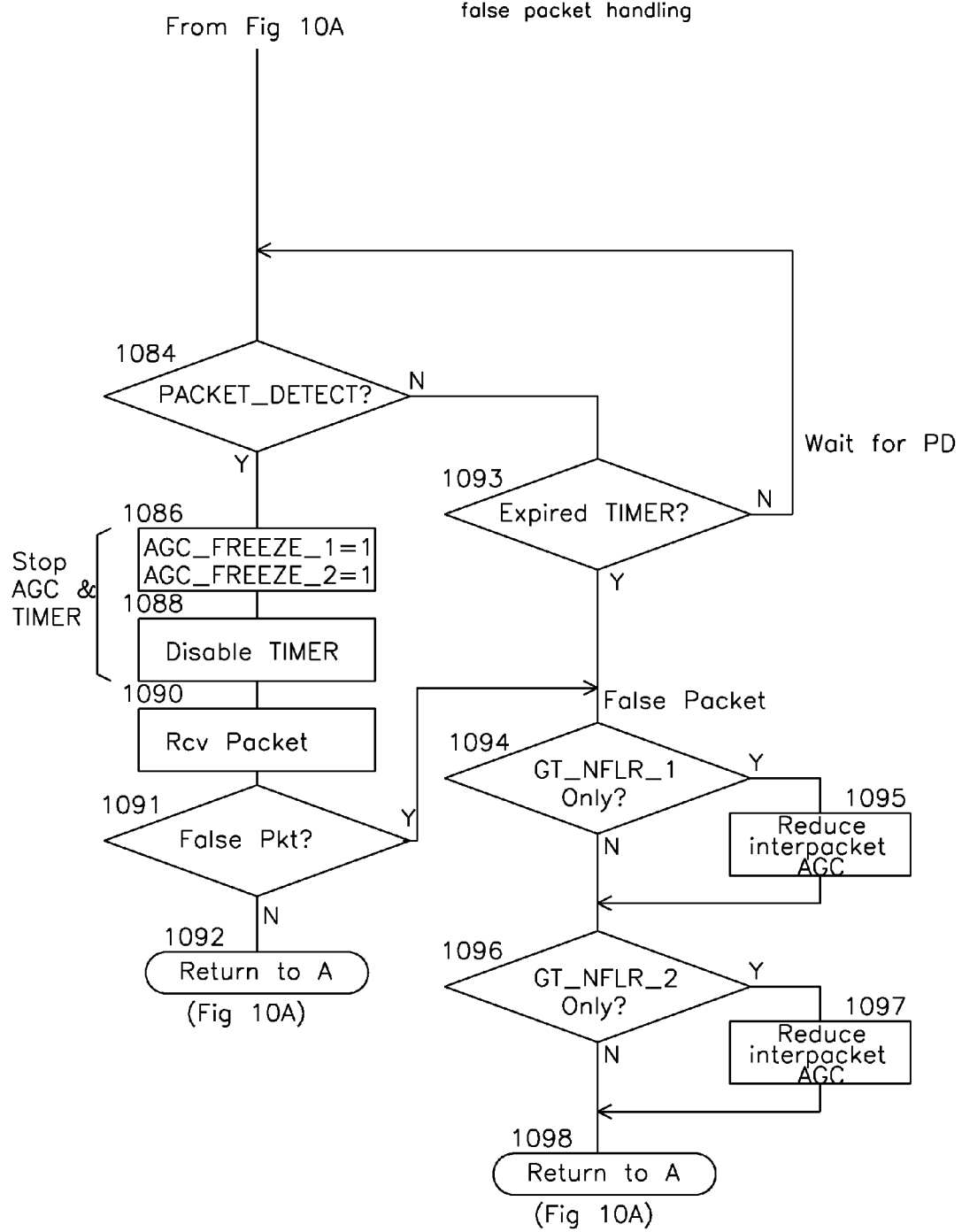

FIGS. 10A and 10B describe the packet detection as a process. The process starts at entry 1002, and in step 1004 the variables PD_RESET, SNR_MODE, GT_NFLR_1, GT_NFLR_2, AGC_FREEZE_0, AGC_FREEZE_1, C1, and C2 are initialized to provide equal weight to both RX_IQ streams. The AGC process described in FIG. 11C operates concurrently with steps 1006, 1005, 1008, 1012, and 1016, providing the AGC status signals GT_NFLR_1, GT_NFLR_2, and AGC_LOCK. If neither channel is has a strong signal as determined from GT_NFLR_1 and GT_NFLR_2 1006, the processing continues at FIG. 10B. If both GT_NFLR_1 and GT_NFLR_2 are asserted 1005 for both strong streams, step 1007 asserts PD_RESET, sets SNR_MODE to HIGH, and selects one of the available strong streams and sets the others to 0 using C1 and C2. If either GT_NFLR_1 1008 or GT_NFLR 2 1012 is asserted, the respective steps 1010 and 1014 are performed, which assert PD_RESET and set SNR_MODE to HIGH. After assertion of PD_RESET in steps 1010 or 1014, step 1016 is performed whereby the controller waits for the assertion of AGC_LOCK, indicating completion of the AGC process as described in FIG. 1C. Upon the assertion of the last AGC_LOCK signal from a channel with an associated GT_NFLR_{1,2}, the false packet detect timer 1017 is started. PD_RESET signal is unasserted in step 1018, allowing the packet detector to resume searching for a packet.

FIG. 10B shows the handling associated with false packet handling, where upon expiration of the timer 1093 started after signal power increase 1017, if no packet is detected 1084 such as by preamble sliding correlation, and the timer expires 1093, the AGC process is reset and the packet acquisition process is started at the beginning of FIG. 10A. If a packet is detected such as by packet detection output 516 of FIG. 5, the timer is disabled 1088 with AGC_FREEZE asserted 1086, which suspends any AGC which may have been in progress prior to packet detection, and the timer is disabled 1088. The packet is received in step 1090, or a false packet 1091 is detected such as by the baseband processor, starting the false packet handling at 1094. If a proper packet is received in step 1090, the process returns 1092 to the beginning of FIG. 10A. If no packet is received, the false packet process of 1094 is performed, whereby the interpacket gain is reduced 1095, 1097 for the corresponding channel 1094, 1096 before returning 1098 to the beginning of the process.

The example embodiment set forth is for understanding of the invention, and is not meant to limit the invention to a particular wireless protocol or packet detect configuration. The invention may be practiced on the family of WLAN packet protocols based on the family of IEEE 802.11 standards or WiMAX packet protocols based on the family of IEEE 802.16e standards.

What is claimed is:

1. A method for setting an inter-packet gain in a receiver accepting wireless packets having a preamble and a payload and converting said wireless packets to a baseband digitized output, the receiver having a gain control input for changing a gain level, said receiver coupled to a baseband processor for detecting said packet, the method comprising:

during an interpacket interval, iteratively measuring an inter-packet noise level of said baseband digitized output and adjusting the value of said gain control input to generate a baseband digitized output amplitude Eopt, thereafter maintaining said interpacket gain control input value during a signal increase detection interval until an increase in the energy level of said baseband digitized output is detected, and:

if said energy level increase is below an energy threshold, performing a one-step gain control input value adjustment and thereafter maintaining said one-step gain control input value while said baseband processor is enabled for packet detection;

if said energy level increase is above said energy threshold, performing multiple gain control steps in succession to bring said signal level to a preamble gain level while said baseband processor packet detection is disabled until said multiple gain control steps are completed, thereafter enabling said baseband processor packet detection;

where said interpacket interval gain control input value is established from the minimum gain level required for said baseband processor to detect said packet under a minimum signal condition Eopt, and said energy threshold is at least 10 dB above a noise floor level;

and where said signal increase is determined using an accumulator comparing the energy level in previous n samples of said baseband digitized output, and where said accumulator is operative using a smaller value n for a large energy level increase than for a comparatively smaller energy level increase.

2. The process of claim 1 where said Eopt is established by subtracting from a maximum digitization level the sum of:
a PAPR difference between a modulation type and a preamble PAPR
and the difference between the SNR for a modulation type and the SNR of a preamble;
where at least one of said modulation types is 64-QAM.

3. The process of claim 2 where said modulation type is 64-QAM and said preamble is BPSK.

4. The process of claim 2 where at least one of said modulation types is 64-QAM.

5. The process of claim 1 where said baseband processor packet detection is based on correlating repeated preamble symbols.

6. The process of claim 1 where said baseband processor packet detection disabled includes suspension of a packet detect based on correlating repeated preamble symbols until said multiple gain control steps are completed.

7. The process of claim 1 where, if said baseband processor does not detect said packet after the duration interval of a preamble, said process returns to said interpacket interval gain control step using a previous value for said interpacket gain control value.

8. The process of claim 1 where said measuring an interpacket noise level and said accumulator energy level measurement are operative on a quadrature baseband digitized output.

9. The process of claim 1 where the measurement of said energy level is performed by accumulating n previous values, and where a large said detected energy level increase uses a smaller number n of accumulations than a small said detected energy level increase.

10. The process of claim 1 where the initial gain control input value of said interpacket interval step is set to the previous interpacket gain control input value prior to detection of a packet by said baseband processor.

11. A process for performing AGC on a wireless receiver having an antenna coupled, in sequence, to an adjustable gain amplifier, a baseband mixer, and an analog to digital converter generating a digitized baseband output, the digitized baseband output coupled to a baseband processor capable of detecting a packet when enabled, the process having:
   an interpacket gain control step where said adjustable variable gain amplifier is set to generate a digitized baseband output level Eopt sufficient to detect an increase in energy level of said digitized baseband output;
   a energy level increase detection step where said digitized baseband output is coupled to a first accumulator summing the energy of a current digitized baseband output sample and the energy of n−1 previous digitized baseband output samples, and also to a second accumulator summing the energy of the previous n digitized baseband output samples, said energy level increase detector indicating an energy level increase when said first accumulator value is greater than said second accumulator value by a first threshold for a range of values n;
   a gain control step where:
      when said energy level increase detection step indicates said energy level increase is below an energy threshold, said baseband processor packet detector is enabled while said adjustable gain amplifier has a gain level which is adjusted in a single step, and
      when said energy level increase detection step indicates said energy level increase is above an energy threshold, said baseband packet detector is disabled until a multi-step gain control adjustment of said gain control value is completed, after which said baseband packet detector is enabled.

12. The process of claim 11 where said first accumulator and said second accumulator use a smaller value n when large energy level increases are detected than when energy level increases are detected which are less than said large energy level increases.

13. The process of claim 11 where, following a preamble duration after said energy level increase detection step indicates an increase in said energy level and said one-step AGC operation is performed, if said baseband processor packet detector does not detect a packet, said process restarts at said interpacket gain control step using a previous interpacket gain control value prior to said energy level increase detection step.

14. The process of claim 11 where said energy threshold is greater than 10 dB.

15. The process of claim 11 where said Eopt signal level is at least 40 dB above the quantization noise of said ADC.

16. The process of claim 11 where said energy level detection step operation uses quadrature baseband output signals.

17. The process of claim 11 where said accumulator is operative using n which is one of 4, 8, 16, or 32 depending on the magnitude of said energy level increase.

\* \* \* \* \*